(12) United States Patent
Sonu

(10) Patent No.: US 6,591,282 B1
(45) Date of Patent: Jul. 8, 2003

(54) APPARATUS AND METHOD FOR A DC-INSENSITIVE FIR FILTER FOR OPTICAL PRML CHANNEL

(75) Inventor: Gene Sonu, San Jose, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/543,147

(22) Filed: Apr. 5, 2000

(51) Int. Cl.[7] .............................................. G06F 17/10
(52) U.S. Cl. ...................................... 708/300; 708/322
(58) Field of Search .............................. 708/300, 301, 708/314, 322, 323, 310; 375/236, 232, 222, 295, 257; 600/509

(56) References Cited

U.S. PATENT DOCUMENTS

| | | | | |
|---|---|---|---|---|
| 4,580,275 A | * | 4/1986 | Pirani et al. | ................ 708/323 |
| 5,307,375 A | * | 4/1994 | Wu et al. | ................... 708/323 |
| 5,465,272 A | * | 11/1995 | Smith | ......................... 375/295 |
| 5,528,627 A | * | 6/1996 | Yanagi et al. | ............... 708/322 |
| 5,949,819 A | * | 9/1999 | Bjarnason et al. | ......... 375/222 |
| 5,983,127 A | * | 11/1999 | dePinto | ...................... 600/509 |
| 5,991,339 A | * | 11/1999 | Bazes et al. | ................ 708/323 |
| 6,301,298 B1 | * | 10/2001 | Kuntz et al. | ............... 708/322 |

OTHER PUBLICATIONS

Raimon Jane et al., Adaptive Baseline Wander Removal in the ECG; Comparative Analysis With Cubic Spline Technique, 1992, IEEE, pp. 143–146.*

Nitish V. Thakor et al., Applications of Adaptive Filtering to ECG Analysis: Noise Cancellation and Arrhythmia Detection, Aug. 1991, IEEE Transactions on Biomedical Engineering vol. 38 No. 8, p. 785–794.*

Gene Sonu et al., Partial–Response Maximum–Likelihood Core Development for a CD/DVD Controller Integrated Circuit, Mar. 2001, IEEE Transactions on Magnetics, vol. 37 No. 2, pp. 663–669.*

* cited by examiner

*Primary Examiner*—Chuong Dinh Ngo
*Assistant Examiner*—Chat C. Do
(74) *Attorney, Agent, or Firm*—Pennie & Edmonds LLP

(57) ABSTRACT

A Finite Impulse Response filter (FIR) reduces the effect of baseline wandering of the input signal on convergence. The FIR includes an adder, a DC-Insensitive error calculator, a DC-Insensitive coefficient calculator, and a multiplier. The adder adds a first tap signal to a second tap signal to produce a FIR output signal. The DC-Insensitive error calculator calculates from the FIR output signal an error value that converges to zero while the FIR output signal is subject to baseline wandering. The DC-Insensitive error calculator represents the error value via an error signal. The DC-Insensitive coefficient calculator calculates a coefficient value based upon the error signal and an input signal. The DC-Insensitive coefficient calculator forces the coefficient value to converge to a steady state value while the input signal is subject to baseline wandering. The coefficient value is represented by a coefficient signal. The multiplier multiplies the first input signal by the coefficient signal to produce the first tap signal.

13 Claims, 10 Drawing Sheets

APPARATUS AND METHOD FOR A DC-INSENSITIVE FIR FILTER FOR OPTICAL PRML CHANNEL

BRIEF DESCRIPTION

The present invention relates generally to a finite impulse response filter, and particularly to a DC-Insensitive finite impulse response filter.

BACKGROUND

FIG. 1 illustrates, in block diagram form, a portion of a prior art Optical Partial Response Maximum Likelihood (PRML) Read Channel 20. Read Channel 20 includes Analog to Digital Converter (ADC) 22, Finite Impulse Response Filter (FIR) 26 and Viterbi Decoder 30. ADC 22 receives an RF signal on line 21, which it converts to a digital signal, the x(n) signal on line 23. FIR 26 filters the x(n) signal to generate the y(n) signal, which it couples to Viterbi Decoder 30.

Read Channel 20 functions as expected when the RF signal on line 21 is free from baseline wandering. As used herein, baseline wandering refers to low frequency disturbances of a radio frequency signal. Typically, prior to ADC 22 effort is made to remove baseline wandering from the RF signal using an Eight-to-Fourteen Modulator (EFM) (not illustrated); however, an EFM cannot eliminate the short-term, sample-to sample, effects of baseline wandering. Thus, the RF input to ADC 22, and its output, the x(n) signal, include time variant error attributable to baseline wandering. FIR 26 does not function as desired when the x(n) signal is subject to baseline wandering.

FIG. 2 schematically illustrates FIR 26, a conventional Least Mean Square (LMS) FIR. FIR 26 includes N serially-coupled latches 30, 32 & 34, each with its output signal, an x(n–i) signal, (i is an integer from 1 to I) coupled to one of I Taps 40, 42 & 44. Each Tap i multiplies its input signal, x(n–i), by a coefficient signal, ki(n), to generate a tap output signal. Adder 50 sums the tap output signals to generate the FIR output signal, the y(n) signal. Error Calculator 52 determines the error of the y(n) signal, which it represents via the e(n) signal. Each of the N Coefficient Calculators 60, 62 & 64 uses the e(n) signal to update its associated coefficient signal, ki(n).

The timing diagram of FIG. 3 illustrates the operation of prior art FIR 26 when its input signal, x(n) 80, is free from baseline wandering. The FIR output signal, y(n) 82, quickly settles into a pattern of switching between five ideal values. The error signal, e(n) 84, quickly converges to zero. The timing diagram of FIG. 4 illustrates that the operation of prior art FIR 26 differs substantially when its input signal, x(n) 81, is subject to baseline wandering. The FIR output signal, y(n) 83, never settles into a pattern of switching between a limited set of ideal values. The error signal, e(n) 85, never converges to zero.

FIG. 5 illustrates schematically prior art Coefficient Calculator 59 with which Coefficient Calculators 60, 62 & 64 are realized. Coefficient Calculator 59 implements a conventional Least Mean Square algorithm. The tap weight ki(n) for Tap i at time n is given by Expression (1).

$$ki(n)=ki(n-1)+mu*\text{del } ki(n-1) \text{ when } n>0; =ki \text{ initial when } n=0; \quad (1)$$

where ki(n–1) is the immediately previous value of the tap weight for Tap i;

mu is loop gain;

del ki(n–1) is the increment in the value of the tap weight; and ki initial is the initial value of ki(n).

The increment in the value of the tap weight is given by Expression (2).

$$\text{del } ki\,(n-1)=d[y(n)-y\hat{}(n)]^2/dki(n); \quad (2)$$

where y^(n) is the ideal value corresponding to y(n); and d[y(n)–y(n)]²/dki (n) expresses the derivative of [y(n)–^(n)]² over ki(n).

FIG. 6 illustrates, in block diagram form, prior art Error Calculator 52, which calculates both the error signal, e(n), and the y^(n) signal from the y(n) signal. Error Calculator 52 includes Quantizer 110 and Subtractor 112. Quantizer 110 takes its input, the y(n) signal, and determines the corresponding ideal value, y^(n), using Relationship (3).

$$y\hat{}(n)=q*\text{round}(y(n)/q); \quad (3)$$

where q represents a quantization interval; and

"round" represents a rounding function.

Subtractor 112 determines the error of the output signal, y(n), by subtracting it from the corresponding ideal value. Thus, the error signal, e(n), is given by Expression (3).

$$e(n)=y\hat{}(n)-y(n). \quad (4)$$

Referring again to FIG. 1, the FIR output signal, y(n), can be expressed as the sum of the i Tap outputs, as is done in Expression (5).

$$y(n)=\text{sum}\{ki*x(n-i)\} \text{ for all } i; \quad (5)$$

where x(n–i) is the delayed input sample for Tap i.

Using Expressions (4) and (5) to substitute for y^(n) and y(n) in Expression (2) yields Expression (6).

$$\text{del } ki(n)=2*e(n)x(n-i) \quad (6)$$

Expression (6) shows that both e(n) and ki(n) are related to x(n–1), and if x(n–1) is contaminated with baseline wandering, then both e(n) and ki(n) will be contaminated as well. Thus, Expression (6) reveals that baseline wandering of the x(n) signal prevents both the error signal, e(n), and tap weight signals, ki(n), from converging. A need exists for a FIR capable of converging when its input signal is subject to baseline wandering.

SUMMARY

The Finite Impulse Response filter (FIR) of the present invention reduces the effect of baseline wandering of the input signal on convergence. The FIR includes an adder, a DC-Insensitive error calculator, a DC-Insensitive coefficient calculator, and a multiplier. The adder adds a first tap signal to a second tap signal to produce a FIR output signal. The DC-Insensitive error calculator calculates from the FIR output signal an error value that converges in the presence of baseline wandering. The DC-Insensitive error calculator represents the error value via an error signal. The DC-Insensitive coefficient calculator calculates a coefficient value based upon the error signal and an input signal. The DC-Insensitive coefficient calculator forces the coefficient value to converge to a steady state value while the first signal is subject to baseline wandering. The coefficient value is represented by a coefficient signal. The multiplier multiplies the first input signal by the coefficient signal to produce the first tap signal.

The method filtering of the present invention reduces the effect of baseline wandering of the input signal on convergence. The method begins by multiplying a first input signal subject to baseline wandering by a first coefficient signal representing a first coefficient value to produce a first tap signal. Next, the first tap signal is added to a second tap signal to produce a FIR output signal. The FIR output signal is filtered to produce a filtered FIR output signal that is substantially free from the effects of baseline wandering. The filtered FIR output signal is then compared to an ideal value to generate an error signal that represents an error value. The first input signal is filtered to produce a filtered first input signal that is substantially free from the effects of baseline wandering. Finally, a value for the first coefficient is determined using a Least Mean Square (LMS) relationship, the filtered first input signal and the error signal. The first coefficient value converges to a first steady state value while the first input signal is subject to baseline wandering. The first coefficient value is represented via a first coefficient signal.

BRIEF DESCRIPTION OF THE DRAWINGS

Additional features of the invention will be more readily apparent from the following detailed description and appended claims when taken in conjunction with the drawings, in which:

DETAILED DESCRIPTION

Figure 1:
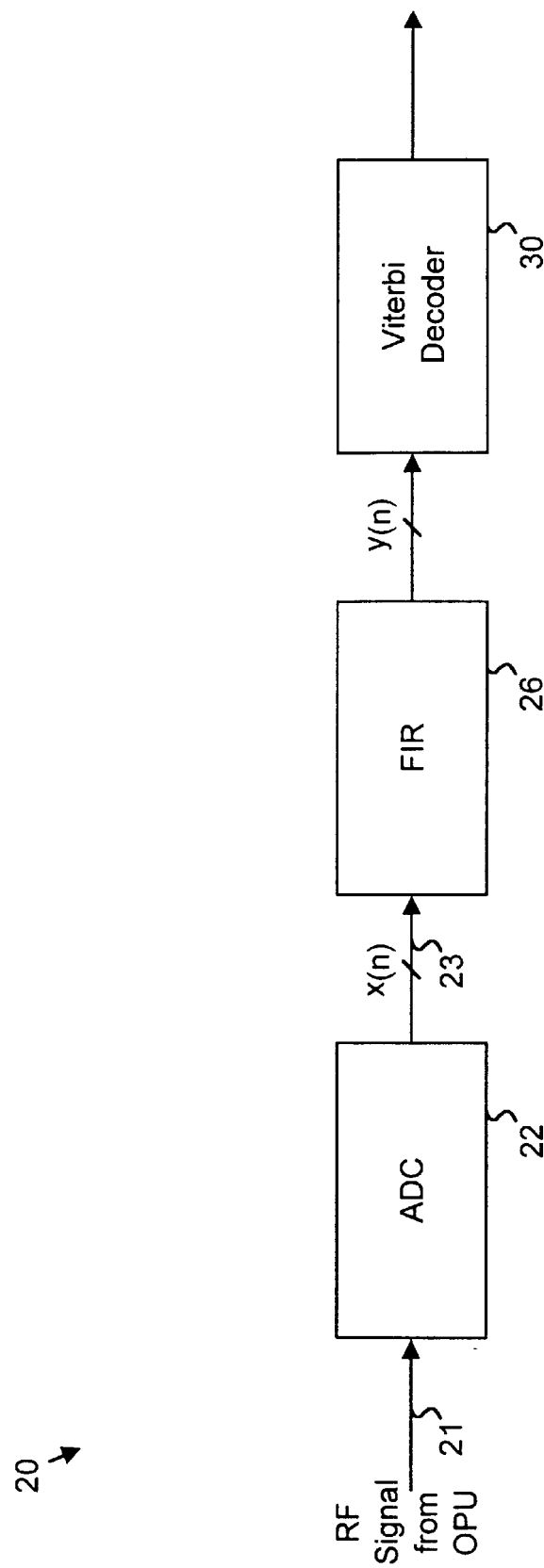
FIG. 1 is a block diagram of a portion of a prior art Optical Partial Response Maximum Likelihood (PRML) Read Channel.
Figure 2:
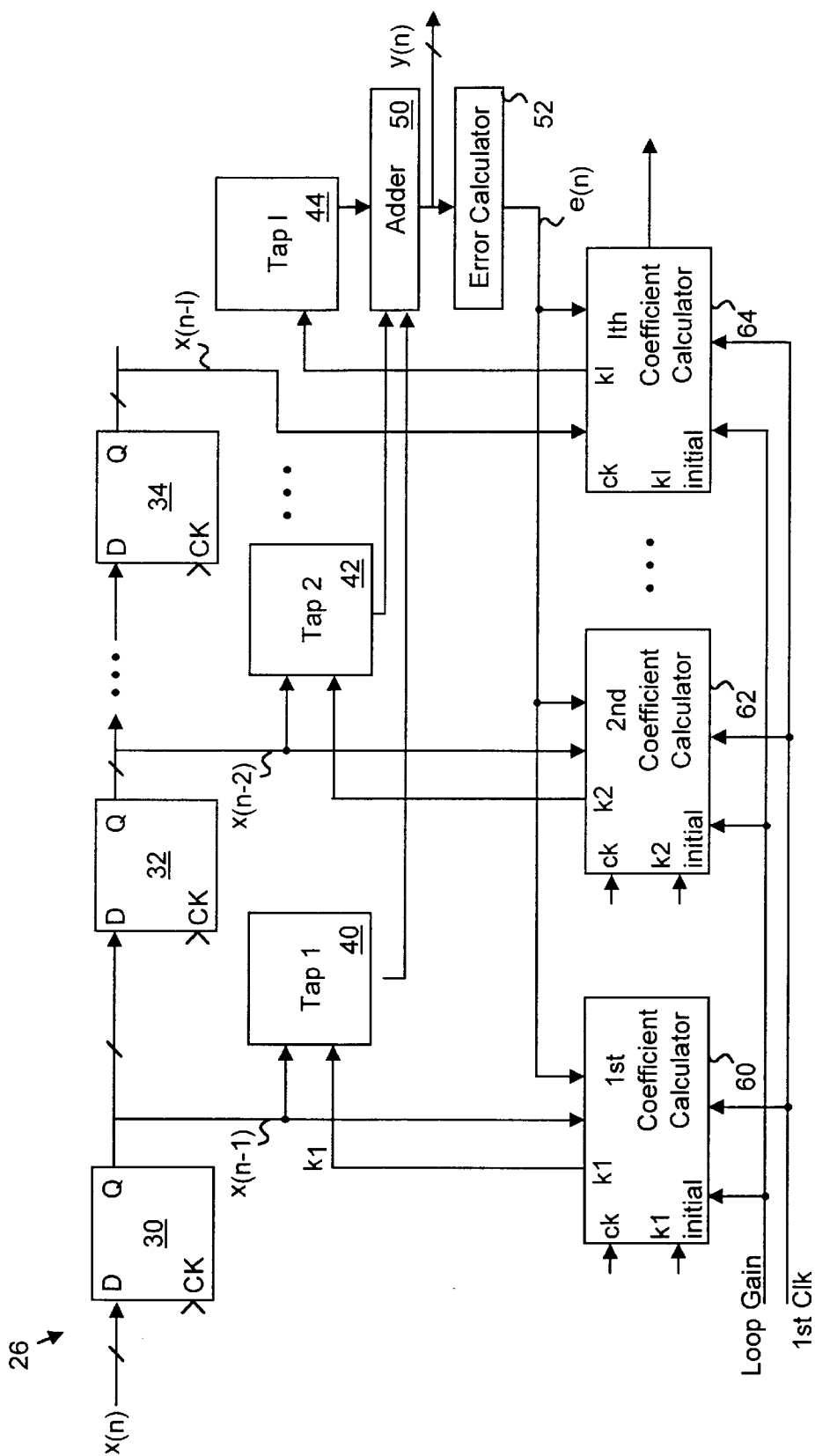
FIG. 2 is a block diagram of the prior art FIR of FIG. 1.
Figure 3:
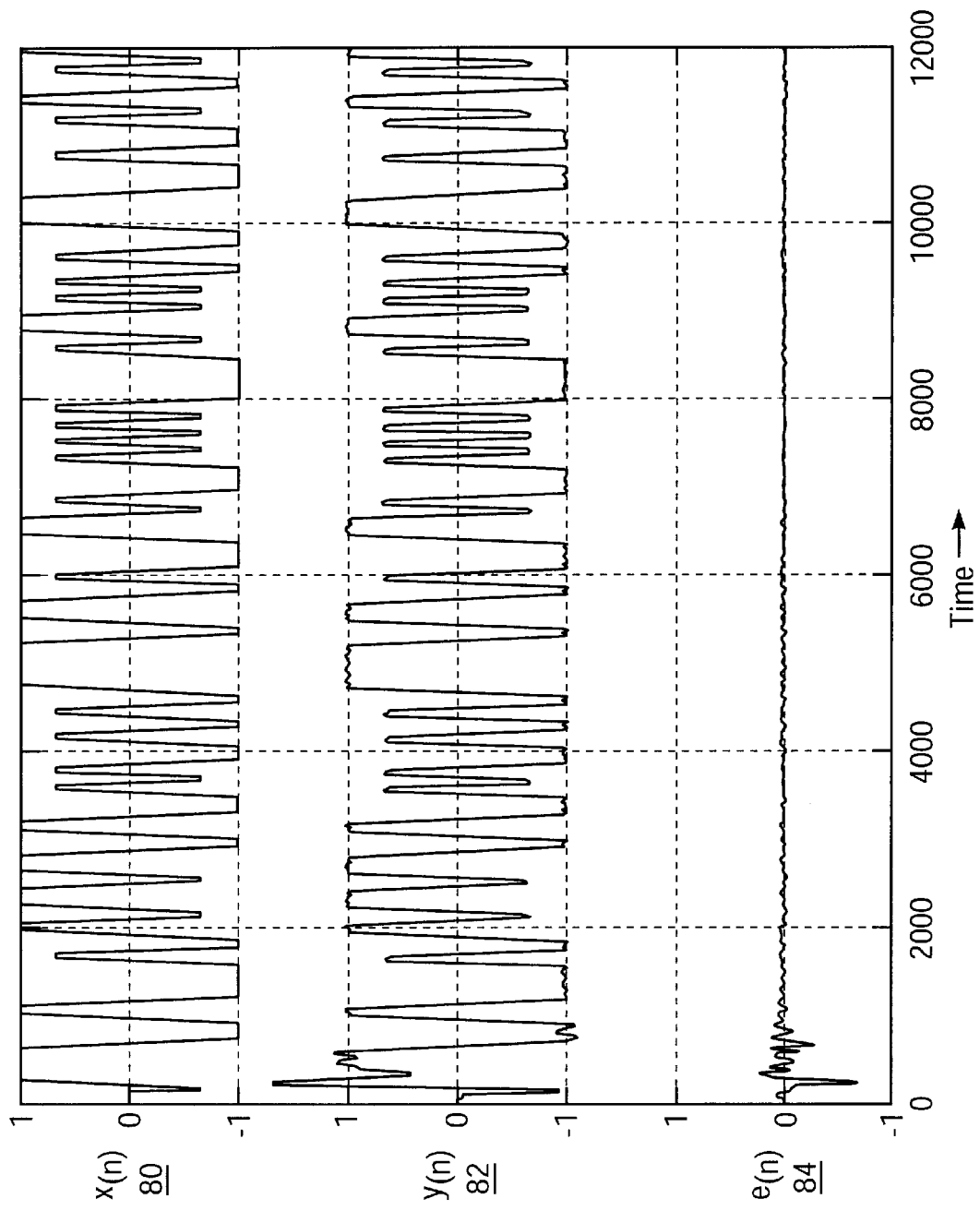
FIG. 3 is a timing diagram for the prior art FIR of FIG. 2 when its input signal is free from baseline wandering.
Figure 4:
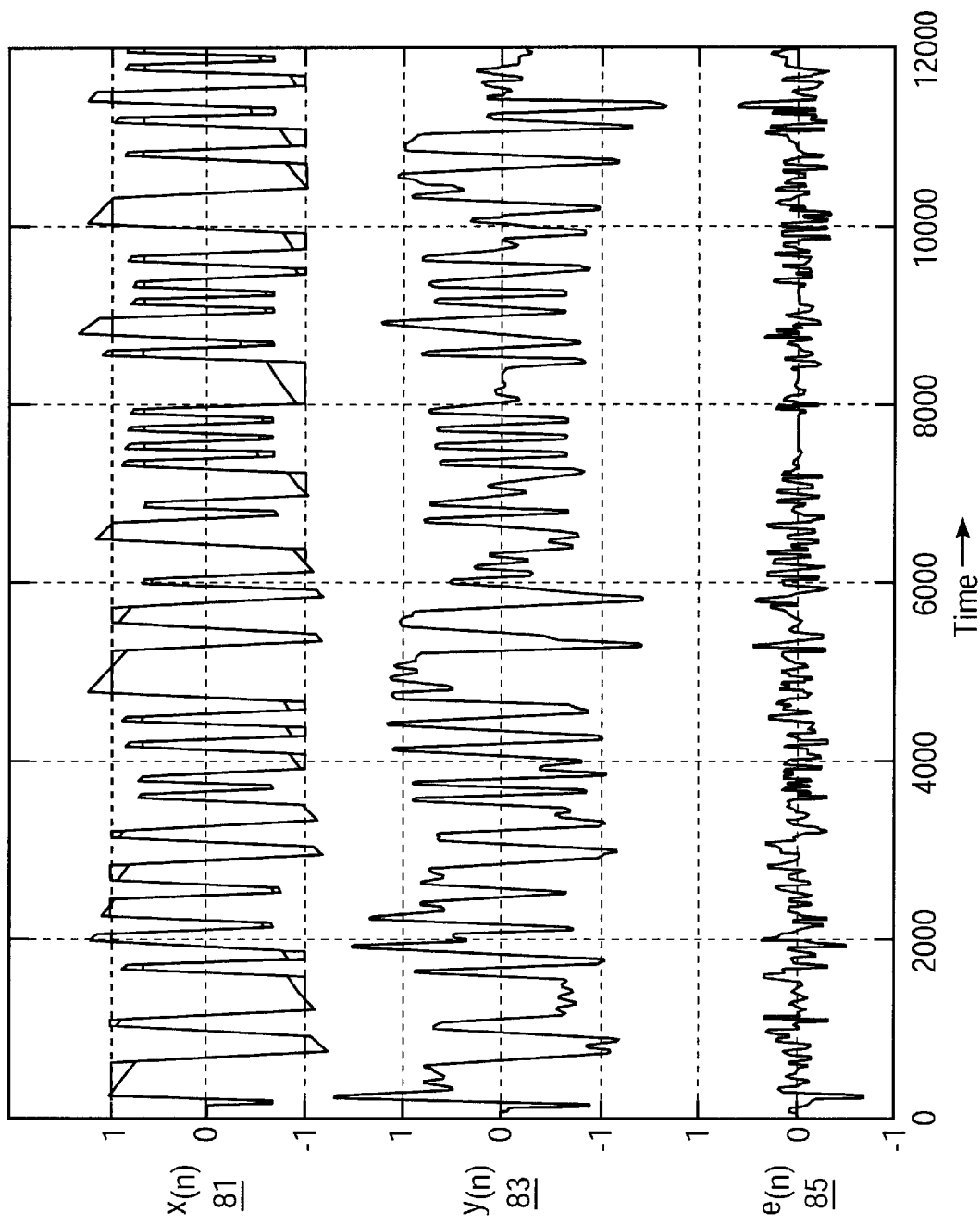
FIG. 4 is a timing diagram of the operation of prior art FIR of FIG. 2 when its input signal is subject to baseline wandering.
Figure 5:
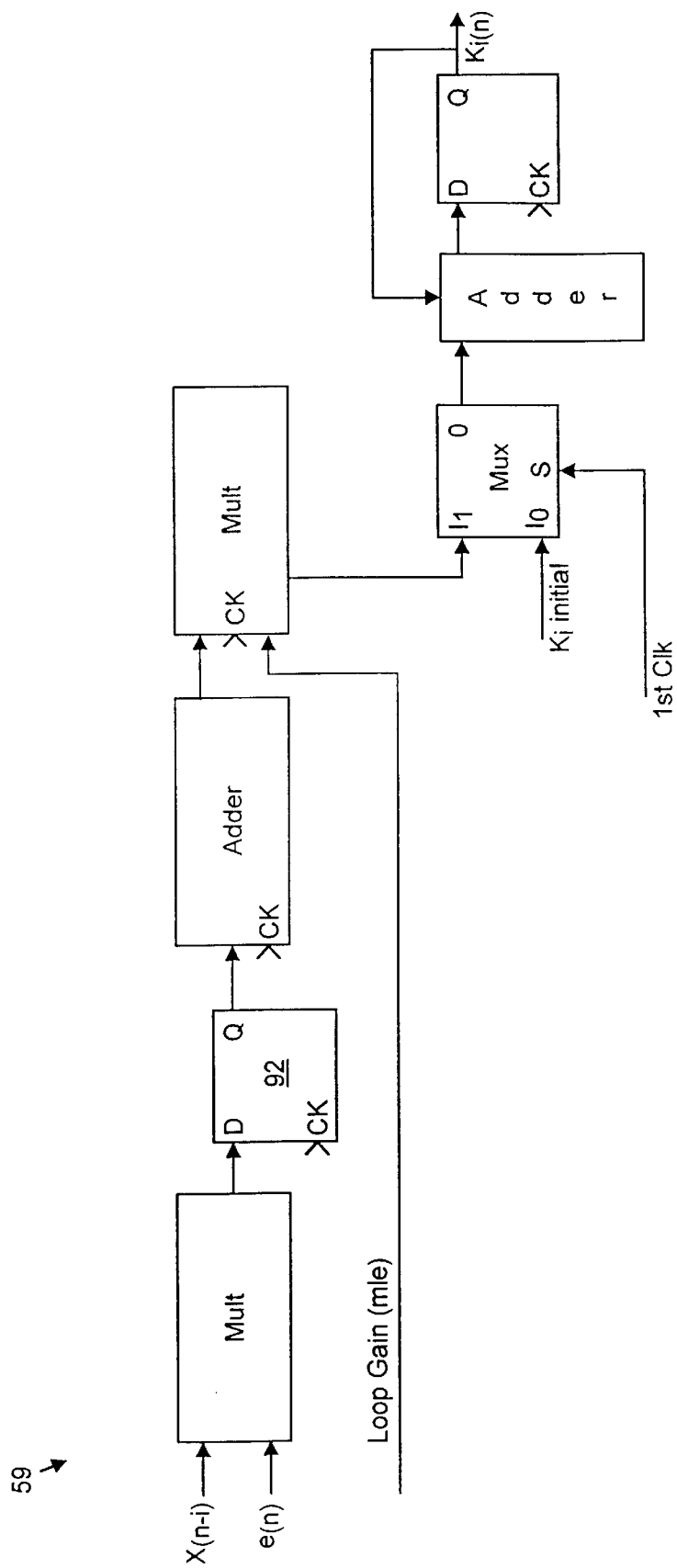
FIG. 5 is a schematic diagram of an instance of a Coefficient Calculator of the FIR of FIG. 2.
Figure 6:
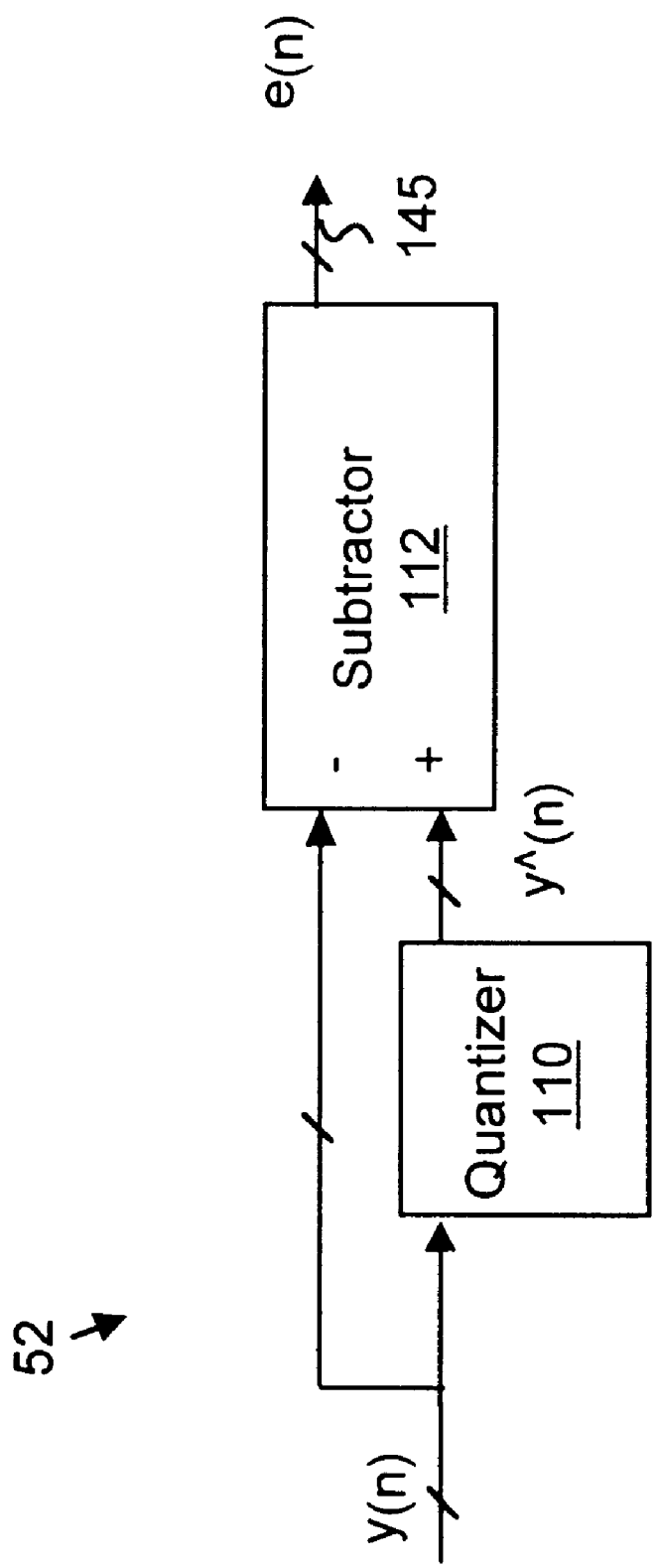
FIG. 6 is a block diagram of an embodiment of the Error Calculator illustrated in FIG. 2.
Figure 7:
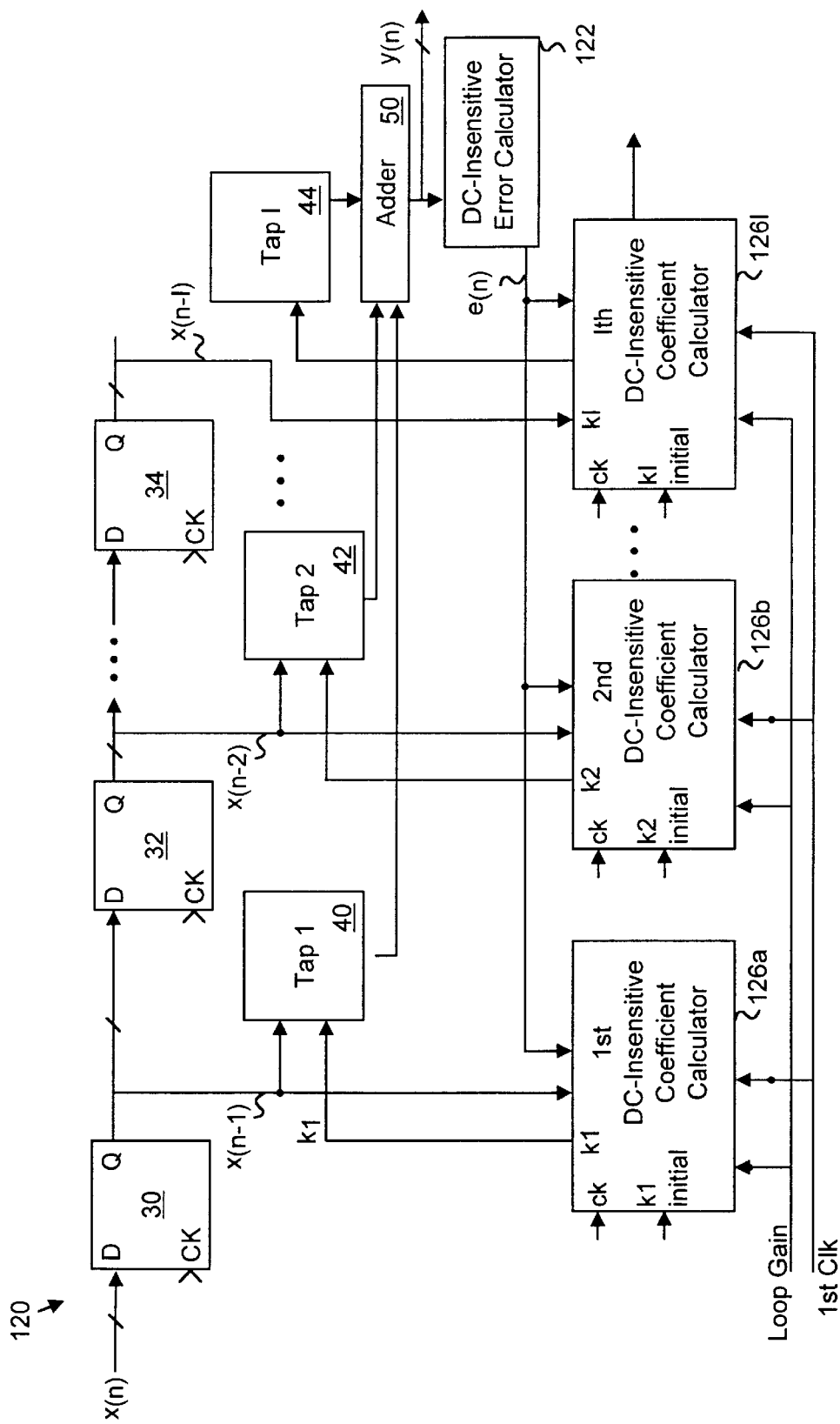
FIG. 7 is a block diagram of the Finite Impulse Response filter of the present invention.

FIG. 7 illustrates, in block diagram form, FIR 120 of the present invention, which converges while its input signal, x(n), is subject to baseline wandering. FIR 120 differs from prior art FIR 26 in that it includes DC-Insensitive Error Calculator 122 and N instances of a DC-Insensitive Coefficient Calculator 126a, 126b & 126I. Together DC-Insensitive Error Calculator 122 and the DC-Insensitive Coefficient Calculators 126a, 126b and 126I substantially reduce the sensitivity of FIR 120 to the baseline wandering of the x(n) signal without reducing the SNR of the y(n) signal. Reduction of the SNR of the y(n) signal is undesirable because it negatively impacts the performance of the Viterbi Decoder 30 (see FIG. 1) of Read Channel 20.

DC-Insensitive Error Calculator 122 and DC-Insensitive Coefficient Calculators 126 each include a Baseline Wander Filter, which increases the minimum sample separation, thereby improving the ideal value estimates used to update tap weight signals, ki(n).

Figure 8:
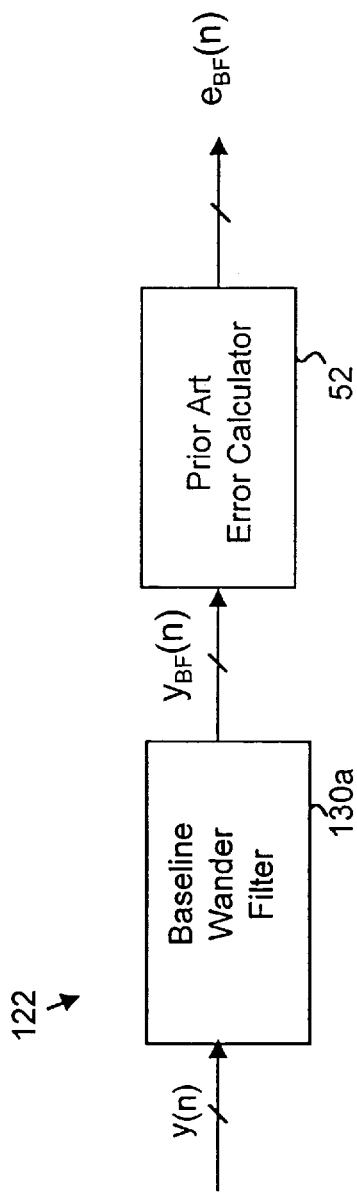
FIG. 8 is a block diagram of the DC-Insensitive Error Calculator of FIG. 7.

FIG. 8 illustrates, in block diagram form, DC-Insensitive Error Calculator 122, which includes Baseline Wander Filter 130a and prior art Error Calculator 52. Baseline Wander Filter 130a filters the y(n) signal to produce a signal free from baseline wandering, the $Y_{BF}(n)$ signal. Given an output signal from which error due to baseline wandering has been substantially eliminated (without reducing its SNR), the $Y_{BF}(N)$ signal, prior art Error Calculator 52 is able to produce an error signal, $e_{BF}(n)$, that is also substantially free from errors attributable to baseline wandering. Expression (7) relates the output of DC-Insensitive Error Calculator 130 to its input.

$$e_{BF}(n)=y_{BF}\hat{}(n)-y_{BF}(n). \tag{7}$$

Figure 9:
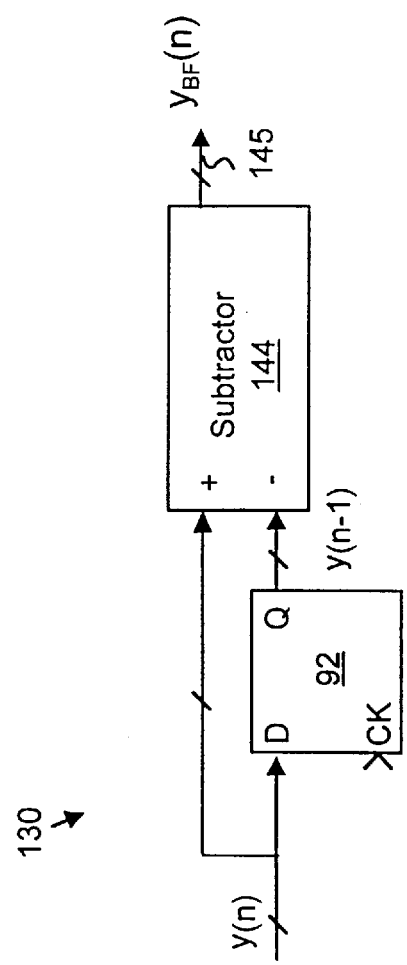
FIG. 9 is a schematic diagram of an embodiment of a Baseline Wander Filter.

FIG. 9 schematically illustrates an embodiment of an instance of a Baseline Wander Filter 130. Baseline Wander Filter 130 includes Latch 140 and Subtractor 144. Latch 140 receives as its input the y(n) signal, which it delays to produce the y(n−1) signal. Subtractor 144 subtracts the y(n−1) signal from the y(n) signal to produce the $y_{BF}(N)$ signal on line 145. The $Y_{BF}(N)$ signal is given by Expression (8).

$$y_{BF}(n)=[y(n)-y(n-1)]. \tag{8}$$

In the time domain, Baseline Wander Filter has a transfer function of:

$$H(t)=1-D; \tag{9}$$

where D represents the delay associated with a single sample interval T.

Replacing D with $e^{j\omega t}$ the transfer function becomes:

$$H(\omega)=2e^{-j\omega T/2}(j\sin(\omega T/2)). \tag{10}$$

Expression (10) demonstrates the phase relationship of the $y_{BF}(n)$ signal to the y(n) signal. In addition to the constant 90° phase shift contributed by the j term, the magnitude of $y_{BF}(n)$ signal varies with frequency because of the $\sin(\omega T/2)$ term of Expression (10). Thus, DC components present in the y(n) signal are eliminated from the $y_{BF}(n)$ signal.

Figure 10:
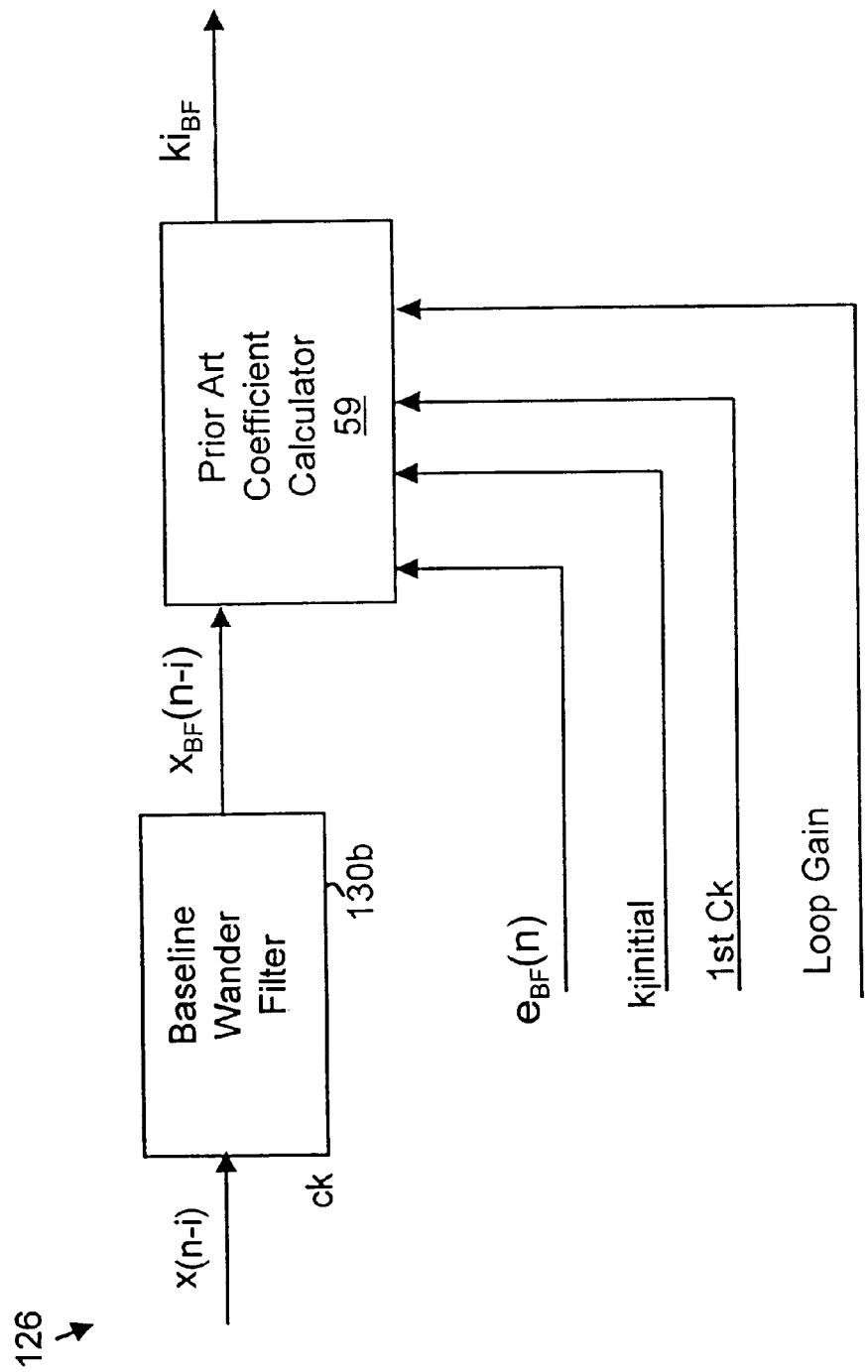
FIG. 10 is a block diagram of the DC-Insensitive Coefficient Calculator of FIG. 7.

FIG. 10 illustrates, in block diagram form, an instance of a DC-Insensitive Coefficient Calculator 126, which includes an instance of a Baseline Wander Filter 130b and a prior art Coefficient Calculator 59. Baseline Wander Filter 130b filters its input, the x(n−i) signal, to produce a signal free from baseline wandering, the $x_{BF}(n-i)$ signal. The relationship between the x(n−i) and $x_{BF}(n-i)$ signals takes the same form as given by Expressions $(_{8-10})$. The $x_{BF}(n-i)$ signal is coupled to prior art Coefficient Calculator 59. Given this input signal, yields an increment del $ki_{BF}$ for tap weight $ki_{BF}$ given by Expression (11).

$$\text{del}_{ki\ BF}(n)=2*e_{BF}(n)x_{BF}(n-i). \tag{11}$$

Elimination of the DC components from the $e_{BF}(n)$ and $x_{BF}(n-i)$ signals allows the increment in the tap weight, del $ki_{BF}(n)$, to converge to zero, thereby allowing the tap weight $ki_{BF}(n)$ to converge to a steady state value even while the x(n) signal is subject to baseline wandering.

Figure 11:
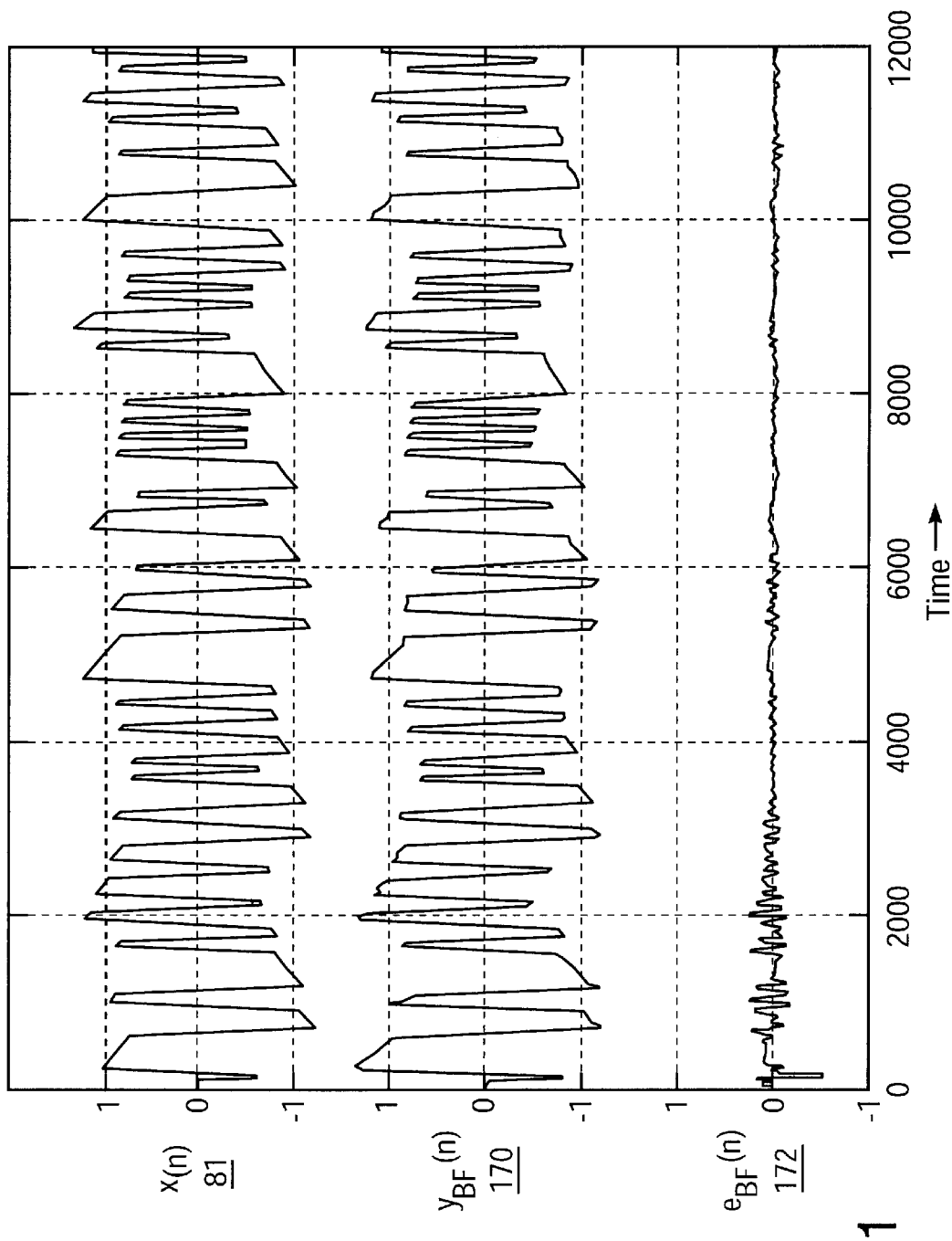
FIG. 11 is a timing diagram of the operation of the FIR of FIG. 7 when its input is subject to baseline wandering.

The timing diagram of FIG. 11 illustrates the operation of DC-Insensitive FIR 120 when its input signal, x(n) 81, subject to baseline wandering. The FIR output signal, $y_{BF}$(N) 170, is free from baseline wandering and quickly settles into a pattern of switching between five ideal values. The error signal, $e_{BF}$(n) 172, quickly converges to a small value near zero.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A DC-Insensitive Finite Impulse Response filter (FIR), comprising:
   an adder adding a first tap signal to a second tap signal to produce a FIR output signal;
   a DC-Insensitive error calculator receiving the FIR output signal and calculating an error value of the FIR output signal, the DC-Insensitive error calculator causing the error value to converge to zero while the FIR output signal is subject to baseline wandering, the error value being represented by an error signal;
   a DC-Insensitive coefficient calculator calculating a first coefficient value based upon the error signal and a first input signal subject to baseline wandering, the DC-Insensitive coefficient calculator causing the first coefficient value to converge to a first steady state value while the first signal is subject to baseline wandering, the first coefficient value being represented by a first coefficient signal; and
   a first multiplier multiplying the first input signal by the first coefficient signal to produce the first tap signal.

2. The DC-Insensitive FIR of claim 1 wherein the DC-Insensitive error calculator comprises:
   a first baseline wander filter receiving and filtering the FIR output signal to produce a DC filtered FIR output signal; and
   an error calculator comparing the DC filtered FIR output signal to an ideal value to produce the error signal.

3. The DC-Insensitive FIR of claim 2 wherein the first baseline wander filter has a transfer function of:

$$H(t)=1-D,$$

where D represents the delay associated with a single sample interval T.

4. The DC-Insensitive FIR of claim 1 wherein the DC-Insensitive coefficient calculator comprises:
   a second baseline wander filter receiving and filtering the first input signal to produce a first DC filtered input signal; and
   a first Least Mean Square (LMS) adaptive coefficient calculator calculating the first coefficient value based upon the error signal and the first DC filtered input signal.

5. The DC-Insensitive FIR of claim 4 wherein the second baseline wander filter has a transfer function of:

$$H(t)=1-D,$$

where D represents the delay associated with a single sample interval T.

6. A DC-Insensitive Finite Impulse Response filter (FIR) comprising:
   a first multiplier multiplying a first signal by a first coefficient signal to produce a first tap signal, the first signal including artifacts of baseline wandering, the first coefficient signal representing a first coefficient value;
   a second multiplier multiplying a second signal by a second coefficient signal to produce a second tap signal, the second signal being a delayed version of the first signal, the second coefficient signal representing a second coefficient value;
   a third multiplier multiplying a third signal by a third coefficient signal to produce a third tap signal, the third signal being a delayed version of the second signal, the third coefficient signal representing a third coefficient value;
   an adder adding the first, second and third tap signals together to produce a FIR output signal;
   a DC-Insensitive error calculator calculating an error value of the FIR output signal, the DC-Insensitive error calculator causing the error value to converge to zero while the FIR output signal is subject to baseline wandering, the error value being represented by an error signal;
   a first DC-Insensitive coefficient calculator calculating the first coefficient value using a Least Mean Square (LMS) relationship, the error signal and the first signal to produce the first coefficient signal, the first DC-Insensitive coefficient calculator causing the first coefficient value to converge to a first steady state value while the first signal is subject to baseline wandering;
   a second DC-Insensitive coefficient calculator calculating the second coefficient using the LMS relationship, the error signal and the second signal to produce the second coefficient signal, the second DC-Insensitive coefficient calculator causing the second coefficient value to converge to a second steady state value while the second signal is subject to baseline wandering; and
   a third DC-Insensitive coefficient calculator calculating the third coefficient value using the LMS relationship, the error signal and the third signal to produce the third coefficient signal, the third DC-Insensitive coefficient calculator causing the third coefficient value to converge to a third steady state value while the third signal is subject to baseline wandering.

7. The DC-Insensitive FIR of claim 6 wherein the DC-Insensitive error calculator comprises:
   a first baseline wander filter receiving and filtering the FIR output signal to produce a DC filtered FIR output signal; and
   an error calculator comparing the DC filtered FIR output signal to an ideal value to produce the error signal.

8. The DC-Insensitive FIR of claim 7 wherein the first baseline wander filter has a transfer function of:

$$H(t)=1-D,$$

where D represents the delay associated with a single sample interval T.

9. The DC-Insensitive FIR claim 7 wherein the first DC-Insensitive coefficient calculator comprises:
   a second baseline wander filter receiving and filtering the first signal to produce a first DC filtered signal; and
   a first LMS adaptive coefficient calculator calculating the first coefficient value based upon the error signal and the first DC filtered signal to produce the first coefficient signal.

10. The DC-Insensitive FIR of claim 9 wherein the second baseline wander filter has a transfer function of:

$$H(t)=1-D,$$

where D represents the delay associated with a single sample interval T.

11. A method of reducing the effect of baseline wandering on a Finite Impulse Response filter (FIR), comprising:

multiplying a first input signal subject to baseline wandering by a first coefficient signal representing a first coefficient value to produce a first tap signal;

adding to the first tap signal a second tap signal to produce a FIR output signal;

filtering the FIR output signal to produce a filtered FIR output signal that is substantially free from the effects of baseline wandering;

comparing the filtered FIR output signal to an ideal value to generate an error signal that represents an error value;

filtering the first input signal to produce a filtered first input signal that is substantially free from the effects of baseline wandering; and determining the first coefficient value using a Least Mean Square (LMS) relationship, the filtered first input signal and the error signal to produce the first coefficient signal, the first coefficient value converging to a first steady state value while the first input signal is subject to baseline wandering.

12. The method of claim 11 wherein filtering the FIR output signal comprises filtering in accordance with a transfer function of:

$$H(t)=1-D,$$

where D represents the delay associated with a single sample interval T.

13. The method of claim 12 wherein filtering the first input signal comprises filtering in accordance with a transfer function of:

$$H(t)=1-D,$$

where D represents the delay associated with a single sample interval T.

* * * * *